(12) United States Patent
Ouchi (10) Patent No.: US 6,844,265 B2
(45) Date of Patent: Jan. 18, 2005

(54) ETCHING METHOD (75) Inventor: Masahiko Ouchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/410,141

(22) Filed: Apr. 9, 2003

(65) Prior Publication Data

US 2003/0194874 A1 Oct. 16, 2003

(30) Foreign Application Priority Data

Apr. 12, 2002 (JP) .......................................... 2002-111143

(51) Int. Cl.[7] .............................................. H01L 21/302
(52) U.S. Cl. ........................ 438/706; 438/710; 438/712; 216/67
(58) Field of Search ................................ 438/706, 710, 438/712, 720; 216/58, 67, 79

(56) References Cited

U.S. PATENT DOCUMENTS 4,595,601 A * 6/1986 Horioka et al. .............. 438/695
5,786,276 A * 7/1998 Brooks et al. ............... 438/724
5,877,032 A * 3/1999 Guinn et al. ..................... 438/9
6,287,699 B1 * 9/2001 Yasuda et al. ............... 428/446

FOREIGN PATENT DOCUMENTS

JP          11-008223          1/1999

* cited by examiner

*Primary Examiner*—Lan Vinh
(74) *Attorney, Agent, or Firm*—Katten Muchin Zavis Rosenman (57) ABSTRACT

To provide an etching method for broadening a trench opening between patterns of an etching mask in a dry process. The etching method of a semiconductor substrate in which silicon and a silicon nitride film are exposed at least on a surface of the semiconductor substrate, comprises an oxidation step of oxidizing the silicon and the silicon nitride film from an exposed surface to a given film thickness by spraying the semiconductor substrate with substances excited by plasma discharge of $O_2$ gas as a reaction gas, and an etching step of etching the semiconductor substrate oxidized in the oxidation step by plasma using a reaction gas comprising at least $O_2$ gas and $CH_2F_2$ gas.

16 Claims, 12 Drawing Sheets

ETCHING METHOD

FIELD OF THE INVENTION

The present invention relates to an etching method for broadening a trench opening between patterns of a silicon nitride film (an etching mask) in a dry process.

BACKGROUND OF THE INVENTION

There is STI (Shallow Trench Isolation) as one of technologies for electrically isolating elements formed on a silicon substrate from one another. The STI is generally formed by forming a trench in Si using as a mask of a $Si_3N_4/SiO_2$ film, burying $SiO_2$ in the trench, and flattening by CMP (Chemical and Mechanical Polishing).

In the STI, dry etching such as RIE (Reaction Ion Etching) is used for forming the trench, in which electrical leakage is caused through crystal defects (e.g., radiation damage etc.) and shape defects (e.g., RIE damage, heterogeneous film of liner $SiO_2$, void/seam of buried $SiO_2$, etc.) as fining proceeds in the semiconductor device. In order to prevent such problems, there is an attempt for improvement through a pullback by a wet process (a wet etching) using heated phosphoric acid etc. Here, the term "pullback" is a step of removing/retracting a part of an etching mask such as $Si_3N_4$ etc., which offers an obstacle at a later step, (in case of STI, a part neighboring the trench, which offers an obstacle in burying $SiO_2$).

SUMMARY OF THE DISCLOSURE

In the wet process by the heated phosphoric acid etc., however, there are some problems as follows. First, the wet process is unsuitable for treating wafers of a large diameter because the size of treated wafers is restricted since large-scale equipment is required. Secondly, a selective ratio is apt to change because it is difficult to control change in percentage of the Si content in a solution. Thirdly, extra steps of oxidizing and removing oxide film are necessary for preventing Si from damage because the selective ratio of $Si_3N_4/Si$ is low.

It is a first object of the present invention to provide an etching method for broadening a trench opening between patterns of an etching mask in a dry process.

It is a second object of the present invention to provide an etching method without a special apparatus.

It is a third object of the present invention to provide an etching method that enables a stable process.

It is a fourth object of the present invention to provide an etching method for controlling a trench opening between patterns of an etching mask.

If pullback is performed in a dry process (dry etching), (1) a system may be on a convenient scale like an asher, (2) it is possible to stabilize the selective ratio, and (3) it is possible to control the selective ratio through a contrivance of a gas system. Therefore, the present invention has been achieved as follows.

With regard to a first aspect of the present invention, there is provided an etching method of a semiconductor substrate in which silicon and silicon nitride film are exposed at least on a surface of said semiconductor substrate, comprising an oxidation step of oxidizing said silicon and said silicon nitride film from an exposed surface to a given film thickness by spraying said semiconductor substrate with substances excited by plasma discharge of $O_2$ gas as a reaction gas, and an etching step of etching said semiconductor substrate oxidized in said oxidation step by plasma using a reaction gas comprising at least $O_2$ gas and $CH_2F_2$ gas.

With regard to a second aspect of the present invention, there is provided an etching method of a semiconductor substrate, comprising providing a semiconductor substrate in which silicon and silicon nitride film are disposed at least on a surface of said semiconductor substrate; and an etching step of etching said silicon nitride film and said silicon by plasma using a reaction gas comprising $O_2$ gas of at least not less than 85% to not more than 95% of a total gas flow and $CH_2F_2$ gas of not less than 5% to not more than 15% of the total gas flow.

With regard to the etching method, it is desirable that $O_2$ gas flow in the etching step is not less than 86% to not more than 94% of the total gas flow, and that $CH_2F_2$ gas flow in the etching step is not less than 4% to not more than 14% of the total gas flow, because a selective ratio of $Si_3N_4/Si$ can be 5 or more.

With regard to a third aspect of the present invention, there is provided an etching method of a semiconductor substrate, comprising providing a semiconductor substrate in which silicon and silicon nitride film are disposed at least on a surface of said semiconductor substrate, and an etching step of etching said silicon nitride film and said silicon by plasma using a reaction gas comprising $O_2$ gas of at least not less than 80% to not more than 95% of a total gas flow, $CF_4$ gas or $CHF_3$ gas of not more than 5% of the total gas flow and $CH_2F_2$ gas of not less than 5% to not more than 15% of the total gas flow.

With regard to the etching method of the second and the third aspect, it is desirable that an oxidation step, in which the silicon and the silicon nitride film is oxidized from an exposed surface to a given film thickness by spraying the semiconductor substrate with substances excited by plasma discharge of $O_2$ gas as a reaction gas, is performed before the etching step, because it is possible to control an etching rate of the silicon nitride film, to stabilize the etching rate and to secure uniformity and control of etching quantity.

With regard to the etching method, it is desirable that a process time in the etching step is not less than 2 times to not more than 3 times of a process time in the oxidation step in case where a process temperature in the etching step is equal to a process temperature in the oxidation step, because it is possible to realize pullback of the silicon nitride film used as an etching mask keeping a good form of the surface.

With regard to the etching method, it is desirable that the semiconductor substrate is heated to a temperature of not less than 200° C. to not more than 350° C. in the oxidation step and is kept at a temperature of not less than 30° C. to not more than 50° C. in the etching step, because it is possible to shorten the process time of the oxidation step.

With regard to the etching method, it is desirable that the oxidation step is performed mounting the semiconductor substrate on a susceptor heated to a temperature of not less than 200° C. to not more than 350° C., and that the etching step is performed raising the semiconductor substrate from a surface of the susceptor to a given height.

With regard to the etching method, it is desirable that the oxidation step is performed mounting the semiconductor substrate on a first susceptor heated to a temperature of not less than 200° C. to not more than 350° C., and that the etching step is performed transferring the semiconductor substrate mounted on the first susceptor to a second susceptor set up at a temperature of not less than 30° C. to not more than 50° C.

With regard to the etching method, it is desirable that the oxidation step is performed by heating the semiconductor substrate to a temperature of not less than 200° C. to not more than 350° C. by radiation of a lamp or lamps installed in a holder holding the semiconductor substrate, and that the etching step is performed setting up the temperature of the semiconductor substrate at not less than 30° C. to not more than 50° C. by stopping radiation of the lamp.

With regard to the etching method, it is desirable that the oxidation step and the etching step are alternately repeated more than 1 time, because it is possible to control the quantity of the pullback (retraction amount) of the silicon nitride film.

With regard to the etching method, it is desirable that the oxidation step and the etching step are successively performed in a same chamber and on a same stage, because it is possible to shorten the necessary time.

With regard to the etching method, it is desirable that a total pressure of the reaction gas in the etching step is not less than 10 Pa (about 0.1 Torr) to not more than 110 Pa (about 0.8 Torr), because it is possible to make the selective ratio of $Si_3N_4/Si$ 4 or more keeping a good surface uniformity.

With regard to the etching method, it is desirable that the semiconductor substrate, in which at least one trench is formed in the silicon using the silicon nitride film as an etching mask, is used, because it is possible to broaden a trench opening (width) between patterns of the silicon nitride film as the etching mask, with the result that it is possible to prevent generation of voids etc. for efficiently burying $SiO_2$ in the trench.

With regard to the etching method, it is desirable that the semiconductor substrate using the silicon as a gate electrode layer and using the silicon nitride film as an etching mask formed on the gate electrode layer is used, because it is possible to narrow a dimension of the gate electrode after the etching mask is patterned.

PREFERRED EMBODIMENTS OF THE INVENTION

Figure 2A:
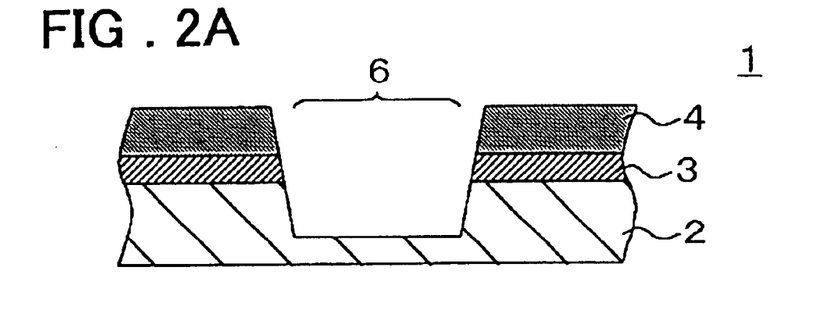
FIGS. 2A, 2B and 2C are systematic and partial cross-sectional views showing steps in an etching method of embodiment 1 of the present invention.
Figure 2B:
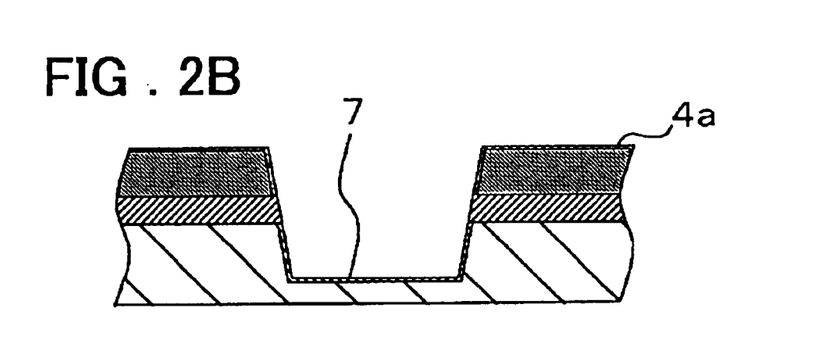
Figure 2C:
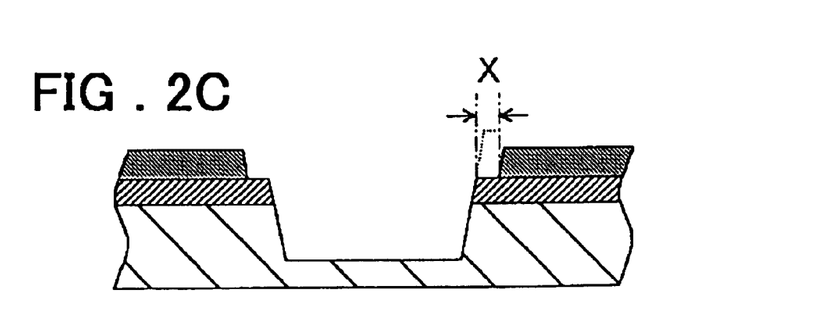

An etching method of a semiconductor substrate (1 in FIG. 2), in which silicon (2 in FIG. 2) and a silicon nitride film (4 in FIG. 2) are exposed at least on a surface of the substrate, comprises an oxidation step (Refer to FIG. 2B) and an etching step (FIG. 2C). In the oxidation step, the silicon and the silicon nitride film are oxidized from an exposed surface to a given film thickness by spraying the semiconductor substrate with substances excited by plasma discharge of $O_2$ gas as a reaction gas. In the etching step, the semiconductor substrate oxidized in the oxidation step by plasma is etched using a reaction gas comprising at least $O_2$ gas and $CH_2F_2$ gas. Therefore, it is possible to broaden a trench opening (opening distance) between patterns of the silicon nitride film (an etching mask) keeping a surface uniformity of the substrate because the etching method forms a SiON film on the surface of the silicon nitride film in the oxidation step and prevents rapid acceleration of an etching rate of the silicon nitride film with lapse of processing time of the etching step.

Figure 1A:
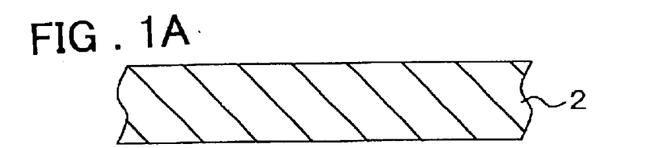
FIGS. 1A, 1B, 1C, 1D, 1E and 1F are systematic and partial cross-sectional views of each step showing a structure of a semiconductor substrate before the oxidation step in an etching method of embodiment 1 of the present invention.
Figure 1B:
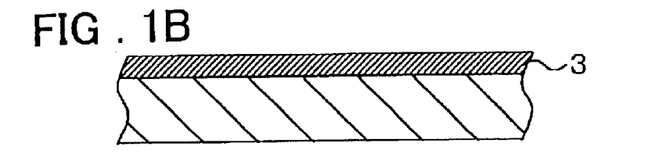
Figure 1C:
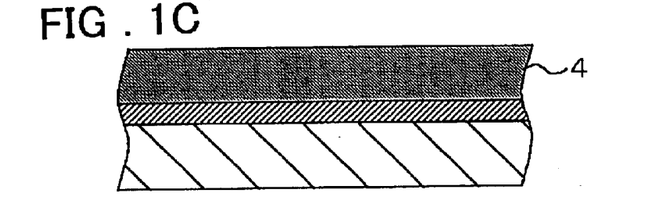
Figure 1D:
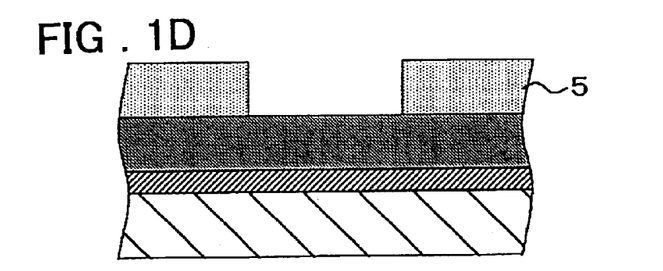
Figure 1E:
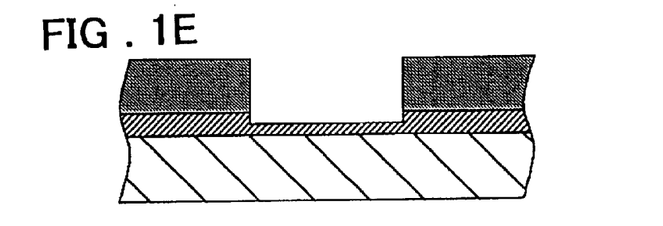

Embodiment 1 of the present invention is explained by using drawings. FIGS. 1A, 1B, 1C, 1D, 1E and 1F are systematic and partial cross-sectional views showing structures of a semiconductor substrate before an oxidation step in a etching method of embodiment 1 of the present invention. FIGS. 2A and 2B and 2C are systematic and partial cross-sectional views showing steps in the etching method of embodiment 1 of the present invention. FIGS. 3A, 3B, 3C and 3D are systematic and partial cross-sectional views showing structures of the semiconductor substrate after a pullback step in the etching method of embodiment 1 of the present invention. FIG. 4 is a systematic view showing a structure of an ashing system in the etching method of embodiment 1 of the present invention.

Figure 1F:
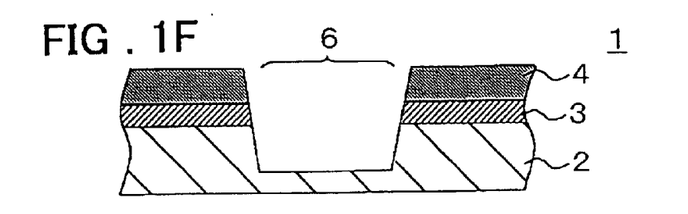

In the semiconductor substrate (a wafer) used in embodiment 1, a trench 6 is formed in a silicon substrate 2 a silicon nitride film 4 and a silicon oxide film 3 as shown in FIG. 1F. The semiconductor substrate 1 is formed by the following steps.

First, the silicon oxide film 3 of 5–15 nm in film thickness is formed on a surface of the silicon substrate 2 by heat oxidation (Refer to FIG. 1B). Second, the silicon nitride film 4 (LP-$Si_3N_4$ film) of 100–150 nm in film thickness is formed on the silicon oxide film 3 by a LPCVD method (Refer to FIG. 1C). Third, a resist pattern 5 is formed on the silicon nitride film 4 by a lithography technology (Refer to FIG. 1D). Fourth, the silicon nitride film 4 and a part of the silicon oxide film 3 are removed by dry etching (anisotropic etching) using the resist pattern 5 as an etching mask until the silicon oxide film 3 is exposed. Then, particles and organic materials are removed by chemicals for cleaning such as SPM ($H_2SO_4$—$H_2O_2$ series), APM ($NH_4OH$—$H_2O_2$—$H_2O$ series), etc. after the resist pattern 5 is removed by plasma "peeling" (Refer to FIG. 1E). Fifth, the silicon oxide film 3 and the silicon substrate 2 are etched to form the trench 6 with a given depth by RIE (isotropic etching) using the silicon nitride film 4 as an etching mask (Refer to FIG. 1F). Lastly, the semiconductor substrate in which the trench 6 is formed is cleaned and rinsed out by chemicals for cleaning such as FPM ($F_2$—$H_2O_2$—$H_2O$ series), APM ($NH_4OH$—$H_2O_2$—$H_2O$ series), SPM ($H_2SO_4$—$H_2O_2$ series), etc. in order to remove native oxide film (peeling deposits) and contaminations.

Next, an etching system used in the etching method of embodiment 1 is explained. In embodiment 1, an ashing system (an asher) as shown in FIG. 4 is used. The ashing system 10, which is a RF down flow asher with an ICP (Inductive coupled Plasma) source having an ICP coil 11 around a plasma generation room 12 connecting a source of gas supply (not illustrated) as a pass, comprises a grid 13 for an ion trap at an exit of a reaction gas in a chamber 15 under the plasma generation room 12 and a bias trap (not illustrated) preventing adding ion bias on a wafer. The grid 13, which is generally of a reticular metal or metal oxide layer, has a high effect when the reticular layer is doubled. A susceptor 14, which mounts the semiconductor substrate 1 on and is heated by radio frequency induction, a heater, and so on, is below the grid 13 in the chamber 15. Gas in the chamber 15 is exhausted by a vacuum.

Next, the etching method of embodiment 1 is explained. The etching method is processed between a trench etching and a trench burying in a step of forming STI. The following oxidation step and pullback step are performed, setting the semiconductor substrate 1, in which the trench 6 shown in FIG. 1F is formed, on the susceptor 14 in the ashing system 10 shown in FIG. 4.

First, an oxidation step is performed. In the oxidation step, excited substances O* excited by plasma discharge of only $O_2$ gas as a reaction gas are sprayed on the semiconductor substrate 1. Then, a SiON film 4a (A composed ratio is non-stoichiometric, adding an arbitrary volume of O to SiN. The following is the same way.), which is made of the silicon nitride film 4 isotropically injected with an oxygen ingredient (oxidized) about 3–30 Å (0.3–3 nm) in depth from an exposed surface (including a sidewall surface), and a silicon oxide film 7, which is made of the silicon substrate 2 isotropically oxidized about 10–30 Å (1–3 nm) in depth from an exposed surface (an inner wall of the trench 6), are formed (Refer to FIG. 2B). Process conditions of the oxidation step in embodiment 1 are shown in Table 1.

TABLE 1

| Process Conditions of the Oxidation Step (Embodiment 1) | |
|---|---|
| Set up Temperature of the Susceptor | 30–50° C. |
| Total Pressure (pressure of $O_2$) | 500 mTorr (66.6 Pa) |
| Flow of $O_2$ | 300–1000 sccm |
| Process Time | 60–100 sec |
| RF Power | 950 W |

Secondly, a pullback step (an etching step) is performed. In the pullback step, a plasma etching (an isotropic etching) is performed under a condition that $O_2$ is rich in $O_2$—$CH_2F_2$ series (a flow of $O_2$ gas accounts for 85–95% or more of a total gas flow), keeping a position of the semiconductor substrate in a same chamber of the oxidation step.

Accordingly, the pullback step can selectively remove (retract) a part (in particular, including a part of the inner wall around the trench 6) of the silicon nitride film 4 (the etching mask), which may offer an obstacle at a later step of burying $SiO_2$. In short, it is possible to get a form which seems as if substantially only the silicon nitride film 4 is isotropically retracted (a form which seems as if a trench opening is stepwise broadened) (Refer to FIG. 2C). And, the pullback step after the oxidation step can stabilize an etching rate and improve a selective ratio, a uniformity of an etching quantity and a control of the etching quantity as compared with the pullback step without the oxidation step.

A selective ratio of $Si_3N_4/SiO_2$ is 20 or more because an order of the etching rate is $Si_3N_4>Si>SiO_2$.

Process conditions of the pullback step in embodiment 1 are shown in Table 2. In Table 2, Selective Ratio A indicates a selective ratio of $Si_3N_4/SiO_2$, and Selective Ratio B indicates the selective ratio of $Si_3N_4/Si$.

TABLE 2

| Process Conditions of the Pullback Step (Embodiment 1) | |
|---|---|
| Set up Temperature of the Susceptor | 30–50° C. |
| Total Pressure (pressure of $O_2$) | 500 mTorr (66.6 Pa) |
| Flow of $O_2$ | 900 sccm |
| Flow of $CH_2F_2$ | 75 sccm |
| Process Time | 120 sec (2 min) |
| RF Power | 950 W |
| Etching Rate ($Si_3N_4$) | 40 Å/min |
| Selective Ratio A (versus $SiO_2$) | 22.5 |
| Selective Ratio B (versus Si) | 5.9 |

With regard to a quantity of the pullback (a quantity of the silicon nitride film 4 retracted in the horizontal direction; Refer to a width X in FIG. 2C) in the pullback (or step-back) step, the quantity of the pullback is about 70 Å (=40 (Å/min)×2(min)−10 Å) if the pullback step is performed on condition of Table 2 in case where a film thickness of the SiON film 4a is 10 Å. By the way, the selective ratio of SiON/$SiO_2$ can be approximated to about 1 although a composition of SiON is irregular because of a non-stoichiometry.

Figure 3A:
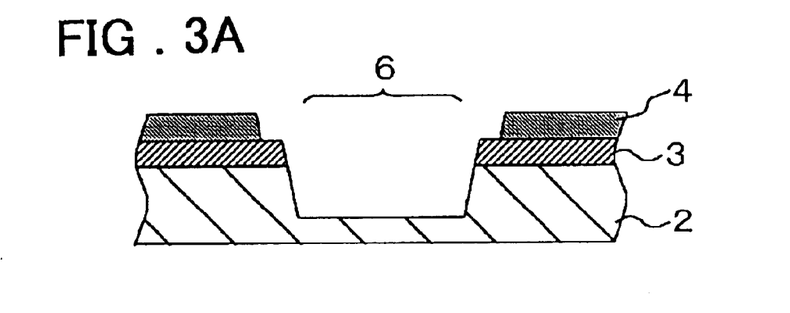
FIGS. 3A, 3B, 3C and 3D are systematic and partial cross-sectional views of each step showing a structure of a semiconductor substrate after the pullback step in an etching method of embodiment 1 of the present invention.
Figure 3B:
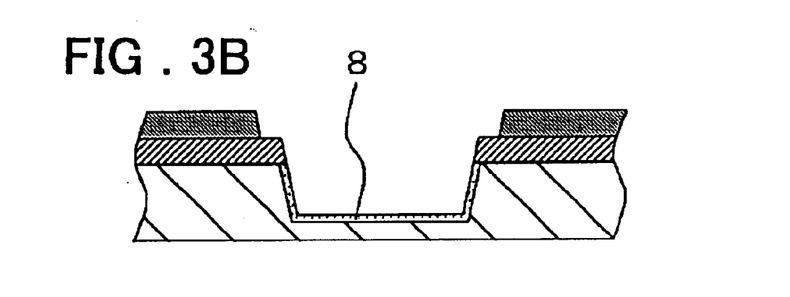
Figure 3C:
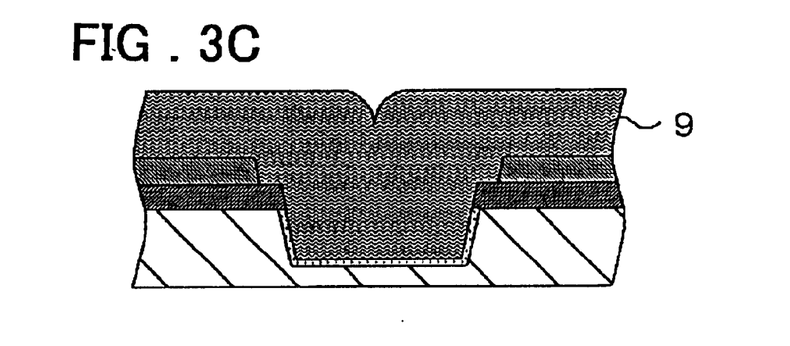
Figure 3D:
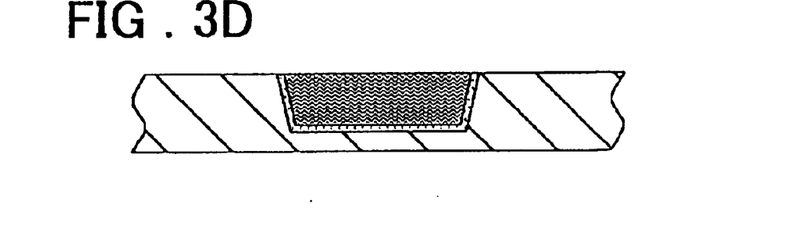
Figure 4:
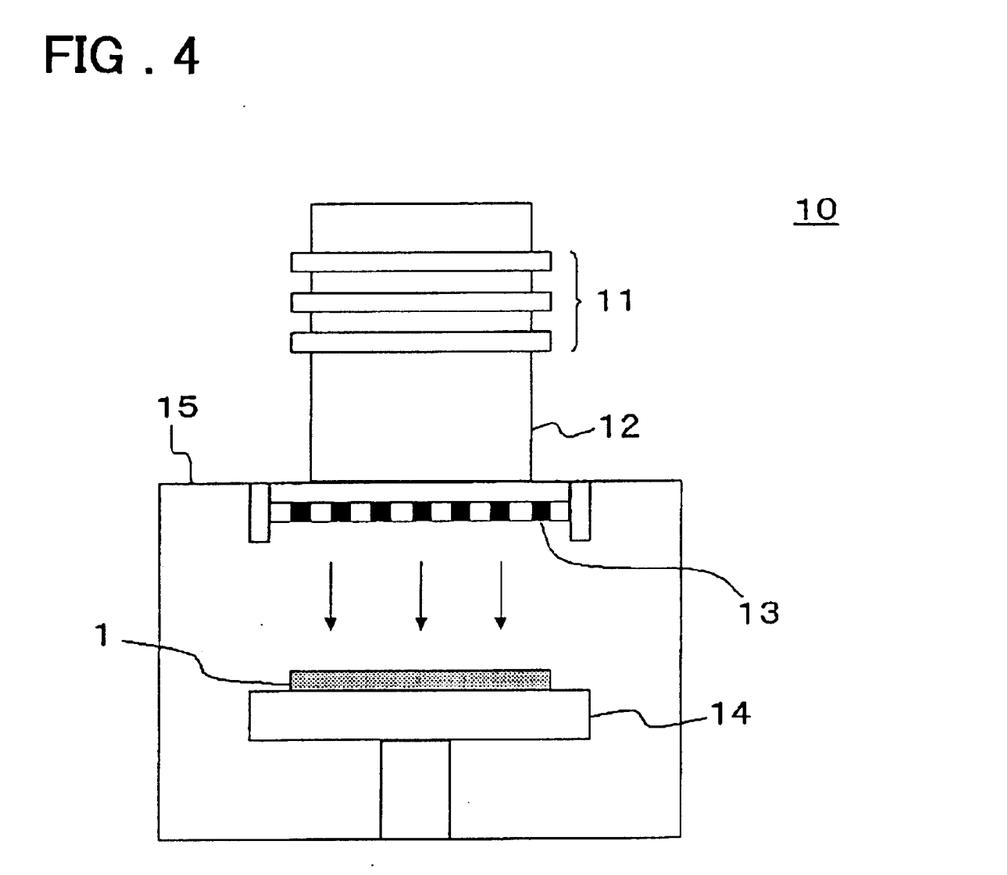
FIG. 4 is a systematic view showing a structure of an ashing system used in an etching method of embodiment 1 of the present invention.

After the pullback step, the semiconductor substrate is cleaned (Refer to FIG. 3A), the inner wall of the trench being oxidized (Refer to FIG. 3B), $SiO_2$ 9 being buried into the trench by CVD (Refer to FIG. 3C), a surface of the semiconductor substrate being flattened by CMP using the silicon nitride film 4 as a stopper of CMP until the silicon substrate 2 is exposed, and a STI structure being gotten (Refer to FIG. 3D). Accordingly, it is possible to prevent generation of voids etc. because $SiO_2$ is effectively buried into the trench.

Then, an effect of embodiment 1 is explained using a reaction mechanism.

Figure 5:
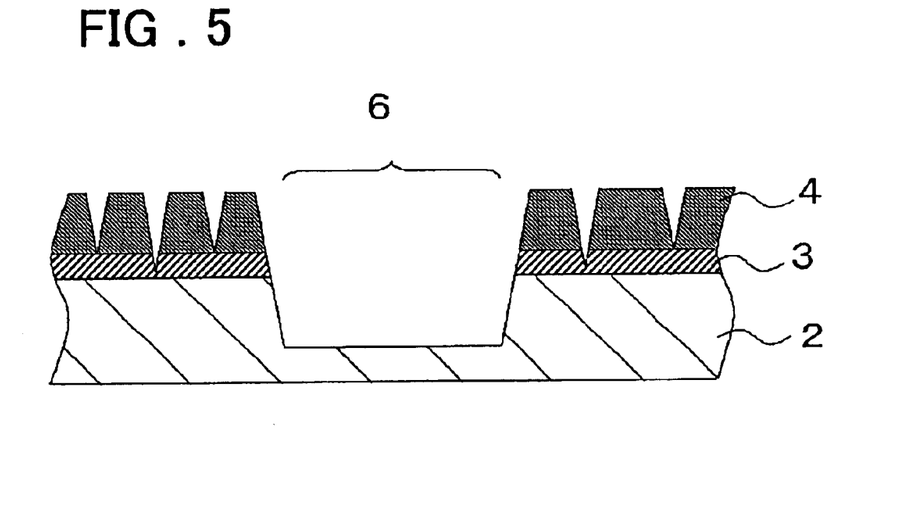
FIG. 5 is a systematic and partial view showing a structure of a semiconductor substrate in an etching method of a comparative example as compared with the present invention.

In embodiment 1, in case where the process time of the oxidation step is insufficient, or the process time of the pullback step is excess, a problem as shown in FIG. 5 arises because of a rapid etching of the silicon nitride film. In short, the surface of the silicon nitride film is rough in case of a slight extent of the rapid etching, or the whole silicon nitride film is consumed in case of a severe extent of the rapid etching. A reason for the problem is as follows.

In the oxidation step, the oxygen ingredient is injected into the surface of the silicon nitride film 4 using only $O_2$ gas in order to control the etching rate. In case where the silicon nitride film 4 without the oxygen ingredient is directly etched by plasma using a reaction gas of $O_2$—$CH_2F_2$ series, the etching rate can not be controlled because the etching rate rapidly rises with lapse of processing time. In short, the injection with the oxygen ingredient into the surface of the silicon nitride film 4 can prevent a rise of the etching rate, stabilize the etching rate, and secure the uniformity of the etching quantity and the control of the etching quantity.

The following reaction formulas as shown in Formula 1 are deduced that excited substances O* and F* are generated from each $O_2$ gas and $CH_2F_2$ gas by plasma excited reactions as mechanisms of rising the etching rate of the silicon nitride film. In Formula 1, the silicon nitride film is shown as "SiN", and silicon fluoride is shown as "SiF".

Reaction Formula 1

Referring to Reaction Formula 1, $\underline{F^*}$ (the excited substance F* generated from SiF) is generated by re-decomposition of SiF in reaction formula (1) caused by combining with other excited substances such as O*. Then, an amount of the excited substance F* increases because $\underline{F^*}$ is added to F* supplied as the processing step proceeds (1) to (3). In short, the whole reaction is prompted because a reaction substance F is generated as a chain reaction in each reaction step, resulting in a rise of the etching rate. Here, excess O* are supplied.

On the other hand, in case where the oxidation step is performed in advance of the pullback step as embodiment 1, the following reactions as Reaction formula 2 occur because the silicon nitride film 4 changes to SiON from the surface to a given depth.

Reaction Formula 2

O*+F*+SiON→<u>SiOF</u>+NO  (1)

O*+F*+SiON→<u>SiOF</u>+NO  (2)

Referring to Reaction Formula 2, F* does not generally increase in reaction formula (2) because F* is hard to generate from SiOF in reaction formula (1). Therefore, the etching rate is stabilized because there is a little (or almost no) difference between the etching rate of reaction formula (1) and (2). In short, it is possible to control an amount of F* in the reaction steps by controlling a flow of a source gas because F* is hard to generate as a chain reaction in the reaction steps. Therefore, it is possible to stabilize the reaction rate.

Accordingly, a combination of the process time of the oxidation step and the pullback step is important. In a case where the process time of the pullback step is too much longer than the oxidation step, shape defects as shown in FIG. 5 are produced. On the other hand, in a case where the process time of the pullback step and the oxidation step is almost equal, the pullback is not processed. Therefore, the desirable process time of the pullback step is 2–3 times as long as the oxidation step in a case where the process conditions of (1) and (2) other than a the kind of gas are almost the same. Then, it is possible to get a good shape of the pullback without defects.

As stated above, according to embodiment 1, it is possible to perform the pullback with a less number of steps because extra steps of oxidizing and removing an oxide film for preventing Si from damage caused by the wet process are unnecessary.

Figure 6:
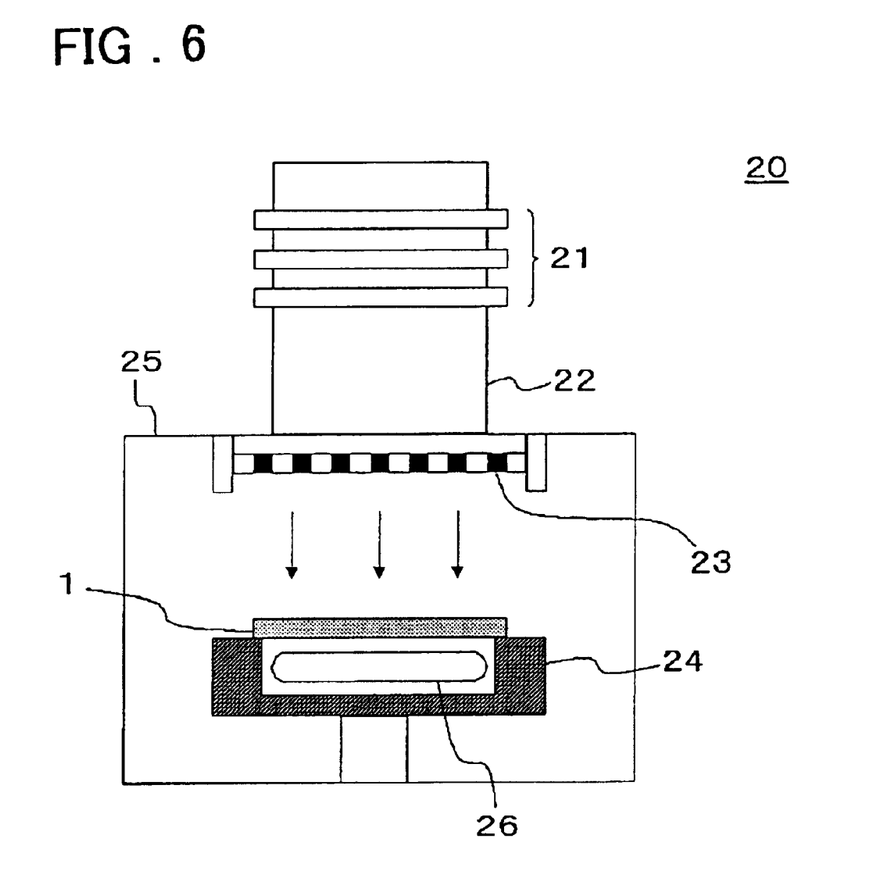
FIG. 6 is a systematic view showing a structure of an ashing system used in an etching method of embodiment 2 of the present invention.

Next, embodiment 2 is explained by using a drawing. FIG. 6 is a systematic view showing a structure of an ashing system used in an etching method of embodiment 2 of the present invention.

A semiconductor substrate (just before an oxidation step) in embodiment 2 is the same as the semiconductor substrate 1 in FIG. 1F. And, an ashing system 20 used in embodiment 2 comprises an unheated holder 24 instead of the susceptor of the ashing system in FIG. 4, a lamp 26, which heats the semiconductor 1 mounted on the holder 24 to a temperature of about 30–250° C. from a holder side (a back side), and a coil 21, a plasma generation room 22, a grid 23 and a chamber 25, which are the same as the system of FIG. 4 (Refer to FIG. 6). According to the ashing system 20, the semiconductor substrate 1 can be heated to a temperature of about 250° C. by turning the lamp 26 ON in the oxidation step and kept at a temperature of about 30° C. by turning the lamp 26 OFF in the pullback step.

With regard to steps of embodiment 2, the semiconductor substrate 1 is set on the ashing system 20, and then the oxidation step and the pullback step are performed in that order. The oxidation step is performed at a process temperature of about 250° C. by turning the lamp 26 ON of the ashing system with the process conditions other than "Set up Temperature of the Susceptor" and "Process Time" in Table 1. The pullback step is performed at a process temperature of about 30° C. by turning the lamp 26 OFF of the ashing system with the process conditions other than "Set up Temperature of the Susceptor" in Table 2. Partial cross-sectional views showing steps in the etching method of embodiment 2 are the same as FIG. 2. According to embodiment 2, the process time of the oxidation step is about 10–15 seconds.

The process temperature of the oxidation step in embodiment 2 is at about 250° C. as stated above but also may be in a range of 200–350° C. Shortening of the process time of the oxidation step is not expected in case where the temperature is lower than 200° C. Demerits that the process time is too short to control or that a cooling time is too long are expected in case where the temperature is higher than 350°° C.

Figure 7:
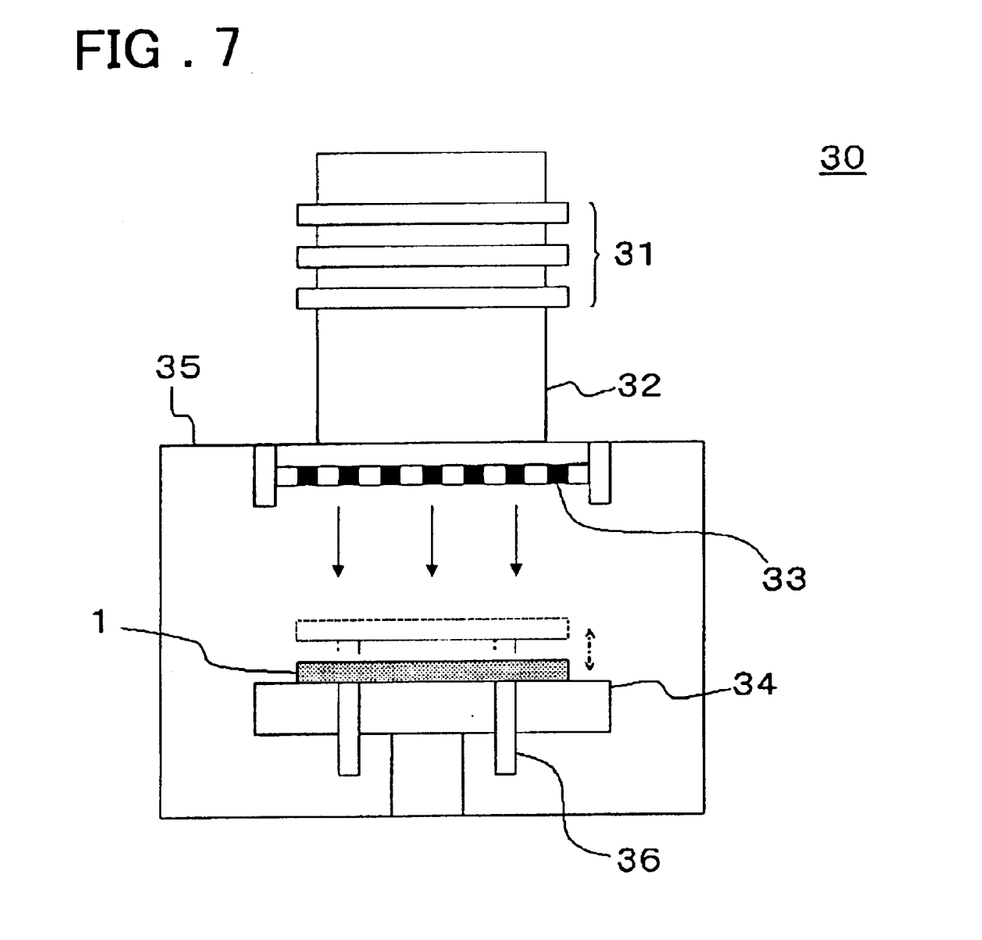
FIG. 7 is a systematic view showing a structure of an ashing system used in an etching method of embodiment 3 of the present invention.

Next, embodiment 3 is explained by using a drawing. FIG. 7 is a systematic view showing a structure of an ashing system used in an etching method of embodiment 3 of the present invention.

A semiconductor substrate (just before an oxidation step) in embodiment 3 is the same as the semiconductor substrate 1 in FIG. 1F. And, an ashing system 30 used in embodiment 3 comprises a susceptor 34 heated to a constant temperature of about 250° C. instead of the susceptor of the ashing system in FIG. 4, a lift 36, which lift up the semiconductor substrate to part from a surface of a holder on the pullback step, and a coil 31, a plasma generation room 32, a grid 33 and a chamber 35, which are the same as the system in FIG. 4 (Refer to FIG. 7). According to the ashing system 30, it is possible to treat the semiconductor substrate 1 at a temperature of about 50° C. in the pullback step in case where the semiconductor substrate 1 is lifted up to part from the susceptor 34 by the lift 36.

With regard to the steps of embodiment 3, the semiconductor substrate 1 is set on the ashing system 30, then the oxidation step and the pullback step are performed in that order. The oxidation step is performed at the set up temperature of the susceptor of about 250° C. with the process conditions other than "Set up Temperature of the Susceptor" and "Process Time" in Table 1, mounting the semiconductor substrate on a surface of the holder. The pullback step is performed with the process conditions other than "Set up Temperature of the Susceptor" in Table 2, lifting up the semiconductor substrate from the surface of the susceptor to a given height, and cooling the semiconductor substrate to a temperature of about 50° C. Partial cross-sectional views showing steps of the etching method in embodiment 3 are the same as FIG. 2. According to embodiment 3, the process time of the oxidation step is about 10–15 seconds.

Figure 8:
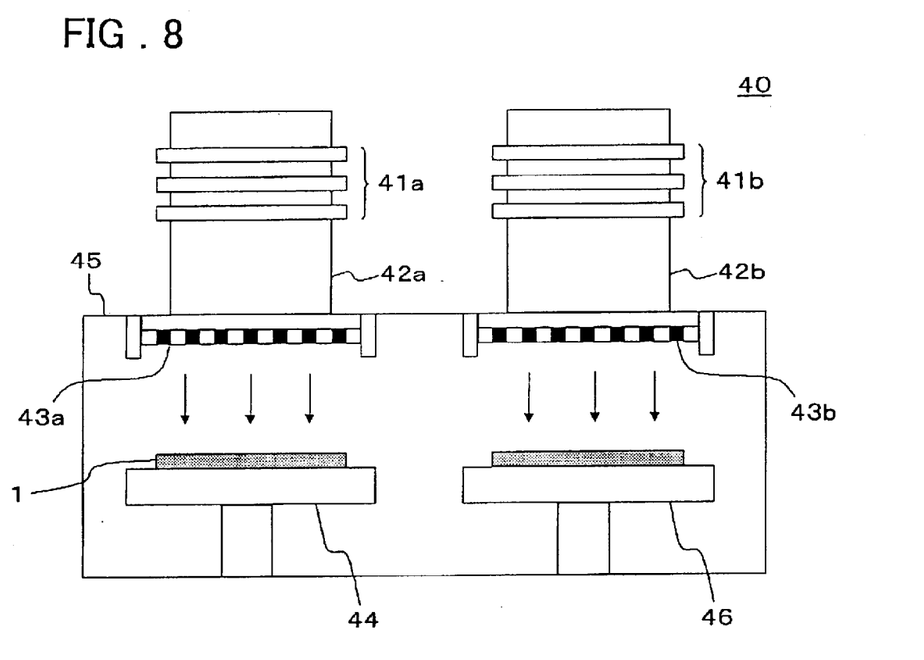
FIG. 8 is a systematic view showing a structure of an ashing system used in an etching method of embodiment 4 of the present invention.

Next embodiment 4 is explained by using a drawing. FIG. 8 is a systematic view showing a structure of an ashing system used in an etching method of embodiment 4 of the present invention.

A semiconductor substrate (just before an oxidation step) in embodiment 4 is the same as the semiconductor substrate 1 in FIG. 1F. And, an ashing system 40 in embodiment 4 comprises a susceptor 44 at a set up temperature of about 250° C. and a susceptor 46 at a set up temperature of about 30° C. within one chamber 45, a transportation (not illustrated), which transfers the semiconductor substrate from the susceptor 44 to the susceptor 46, and coils 41a, 41b, plasma generation rooms 42a, 42b and grids 43a, 43b, which are the same as the system in FIG. 4 (Refer to FIG. 8).

With regard to the steps of embodiment 4, the semiconductor substrate 1 is set on the ashing system 40, then the oxidation step and the pullback step are performed in that order. The oxidation step is performed with the process conditions other than "Set up Temperature of the Susceptor" in Table 1, mounting the semiconductor substrate 1 on the susceptor 44. The pullback step is performed with the process conditions of the pullback step in Table 2, transferring the semiconductor substrate 1 from the susceptor 44 to the susceptor 46. Partial cross-sectional views showing steps of the etching method in embodiment 4 are the same as FIG. 2. According to embodiment 4, the process time of the oxidation step is about 10–15 seconds.

Next, embodiment 5 is explained. In an etching method of embodiment 5, a number of times repeating the oxidation step and the pullback step in embodiment 1 is adapted. Refer to Table 1 and Table 2 for process conditions of each step. A semiconductor substrate is the same as the semiconductor substrate 1 in FIG. 1F. And, an ashing system in embodiment 5 is the same as the ashing system 10 in FIG. 4.

According to embodiment 5, it is possible to adjust to increase a quantity of the pullback (a trench opening between patterns of the silicon nitride film). For example, it is possible to etch a quantity of the pullback of about 210 Å (21 nm) (=70 Å×3 times) in case where the oxidation step and the pullback step, in which the quantity of the pullback per one time is 70 Å (7 nm), are repeated three times. It is unnecessary to use a variant etching system or a chamber (a reaction room) at every step because the oxidation step and the pullback step allow repeating by a process sequence of the etching system.

Next, embodiment 6 is explained. In an etching method of embodiment 6, each process time of the oxidation step and the pullback step in embodiment 1 is relatively shortened. A semiconductor substrate is the same as the semiconductor substrate 1 in FIG. 1F. An ashing system in embodiment 6 is the same as the ashing system 10 in FIG. 4. According to embodiment 6, it is possible to restrict the quantity of the pullback.

Next, embodiment 7 is explained. An etching method of embodiment 7 is performed under a condition that a part (5% or below) of $O_2$ gas flow in the pullback step is replaced with $CF_4$ gas or $CHF_3$ gas. A semiconductor substrate is the same as the semiconductor substrate 1 in FIG. 1F. An ashing system in embodiment 7 is the same as the ashing system 10 in FIG. 4.

With regard to steps of embodiment 7, the oxidation step is performed under the same process conditions as the oxidation step of embodiment 1 (Refer to Table 1). Next, in the process conditions of the pullback step in embodiment 1, a part (5% or below) of $O_2$ gas flow is replaced with $CF_4$ gas or $CHF_3$ gas. Conditions of the pullback step are as follows.

TABLE 3

| Process Conditions of the Pullback Step (Embodiment 7) | |
|---|---|
| Set up Temperature of the Susceptor | 30–50° C. |
| Total Pressure (pressure of $O_2$) | 500 mTorr (66.6 Pa) |
| Flow of $O_2$ | 900 sccm |
| Flow of $CH_2F_2$ | 75 sccm |
| Flow of $CF_4$ or $CHF_3$ | 5–50 sccm |
| Process Time | 120 sec (2 min) |
| RF Power | 950 W |
| Etching Rate ($Si_3N_4$) | 40–80 Å/min |
| Selective Ratio A (versus $SiO_2$) | 18–22.5 |
| Selective Ratio B (versus Si) | 4.7–5.9 |

According to embodiment 7, in case where an amount of a F ingredient in a source gas is increased, it is possible to increase a etching rate of the silicon nitride film keeping the etching rate of the silicon nitride film more rapid than a etching rate of the silicon substrate and to shorten the process time for improving a process performance as compared to embodiment 1 although the selective ratio is somewhat lower than the case without adding $CF_4$ or $CHF_3$.

Next, embodiment 8 is explained. In an etching method of embodiment 8, only the pullback step without the oxidation step in embodiment 7 is performed. According to embodiment 8, the etching rate of the silicon nitride film is kept rapid from the beginning of the process and is prevented from a suddenly fluctuation (a rise).

Next, embodiment 9 is explained by using drawings. FIG. 9 and FIG. 10 are systematic and partial cross-sectional views showing steps of an etching method in embodiment 9 of the present invention.

A semiconductor substrate 90 (a wafer) in embodiment 9 comprises a silicon substrate 91, a gate insulating film 92, a gate electrode layer 93 and an etching mask 94 as shown in FIG. 10B. The etching mask 94 is the silicon nitride film, in which there are, however, some cases where the etching mask is a laminate of the silicon nitride film and the silicon oxide film in forming the gate electrode. Further, the gate electrode layer 93 is doped polysilicon. It also does not matter whether the gate electrode layer 93 is WSi, W, TiSi, Ge, Zr, etc. or a laminate structure of these materials and the polysilicon. The semiconductor substrate 90 is formed by the following steps.

Figure 9A:
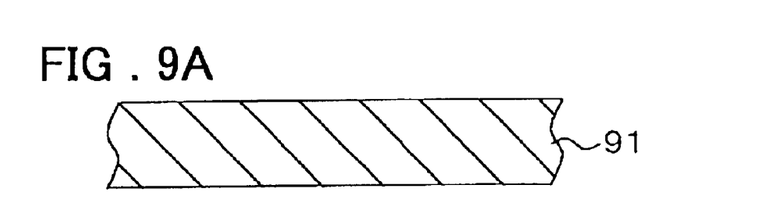
FIGS. 9A, 9B, 9C and 9D are systematic and partial cross-sectional views showing each step in an etching method of embodiment 9 of the present invention (the fist half).
Figure 9B:
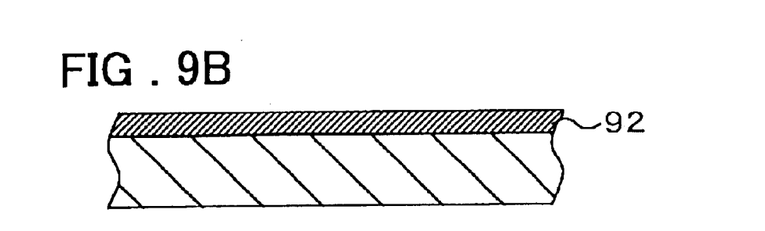
Figure 9C:
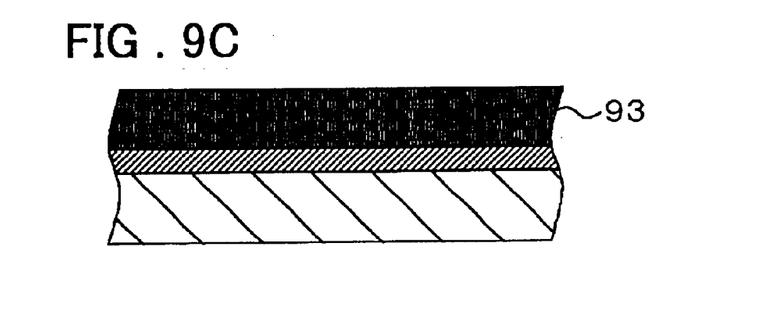
Figure 9D:
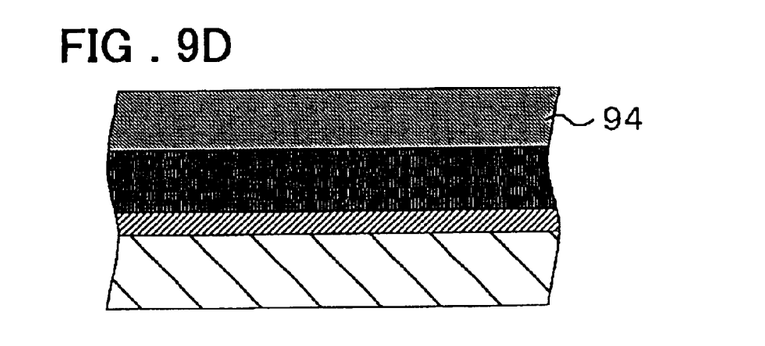
Figure 10A:
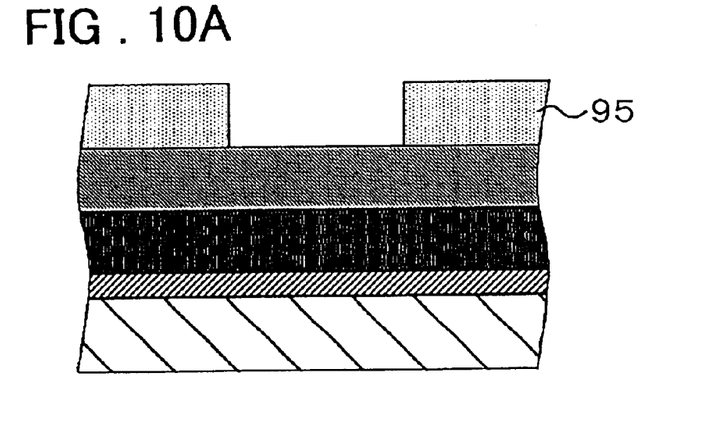
FIGS. 10A, 10B and 10C are systematic and partial cross-sectional views showing each step in the etching method of embodiment 9 of the present invention (the second half).
Figure 10B:
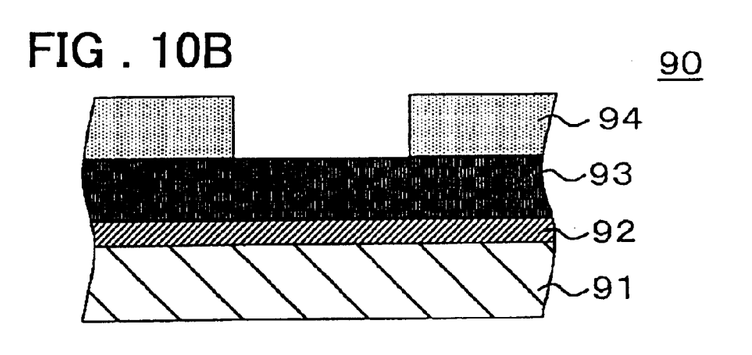
Figure 10C:
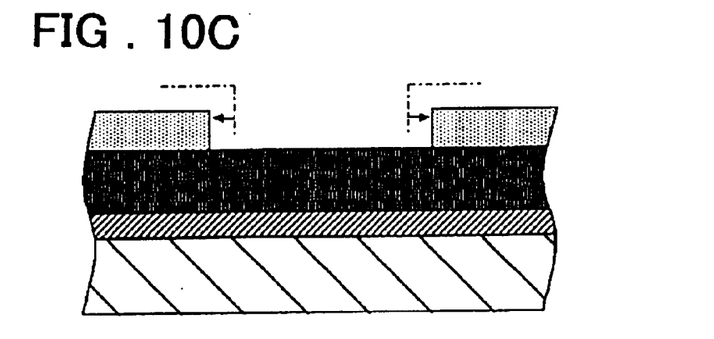

First, the gate insulating film 92 is formed by a heat oxidation of a surface of the silicon substrate 91 (Refer to FIG. 9B). Second, the gate electrode layer 93 is deposited on the gate insulating film 92 (Refer to FIG. 9C). Third, the etching mask 94 is deposited on the gate electrode layer 93 (Refer to FIG. 9D). Fourth, a resist pattern 95 is formed on the etching mask 94 by a lithography technology (Refer to FIG. 10A). Fifth, a part of the etching mask 94 is removed by a dry etching (an anisotropic etching) using the resist pattern 95 as an etching mask until the gate electrode layer 93 is exposed, the resist pattern 95 being removed by a liquid for removal (peeling), and particles and organic materials being removed by chemicals for cleaning such as SPM ($H_2SO_4$—$H_2O_2$ series) etc. (Refer to FIG. 10B).

Next, an etching method of embodiment 9 is explained. In embodiment 9, the pullback step is performed with the process conditions shown in Table 2, in which the semiconductor substrate 90 in FIG. 10B is set on the ashing system 10 in FIG. 4. And then, the semiconductor substrate 90, of which a trench opening of the etching mask 94 is retracted, is formed (Refer to FIG. 10C).

Embodiment 9 is applicable to the pullback (slimming or trimming) of the semiconductor substrate 90 because an etching rate is slow in case where the electrode layer 93 is a silicon series such as polysilicon, and the etching rate is very slow in case where the electrode layer 93 is a metal series such as W.

There often arises a need of narrowing a dimension of the etching mask 94 after a pattern of the etching mask 94 has been formed. In such a case, the pullback can be performed keeping the surface uniformity, without affecting by the pattern, and without etching the gate electrode layer 93.

Figure 11:
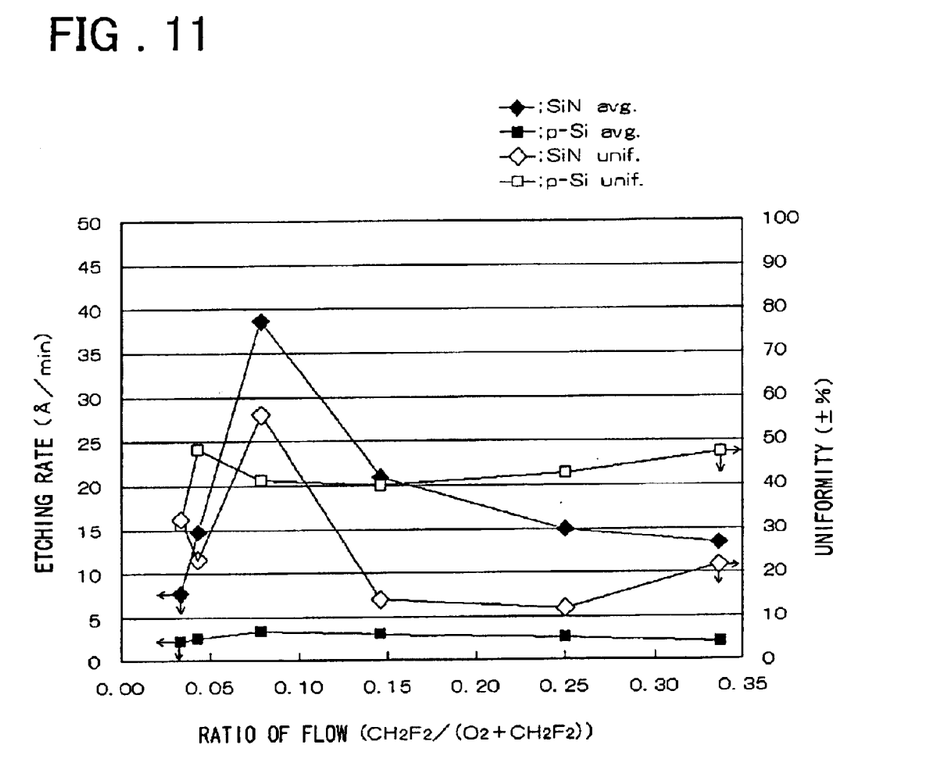
FIG. 11 is a graph showing dependence on a ratio of the $CH_2F_2$ flow versus an etching rate and a surface uniformity of a silicon nitride film and polysilicon.
Figure 12:
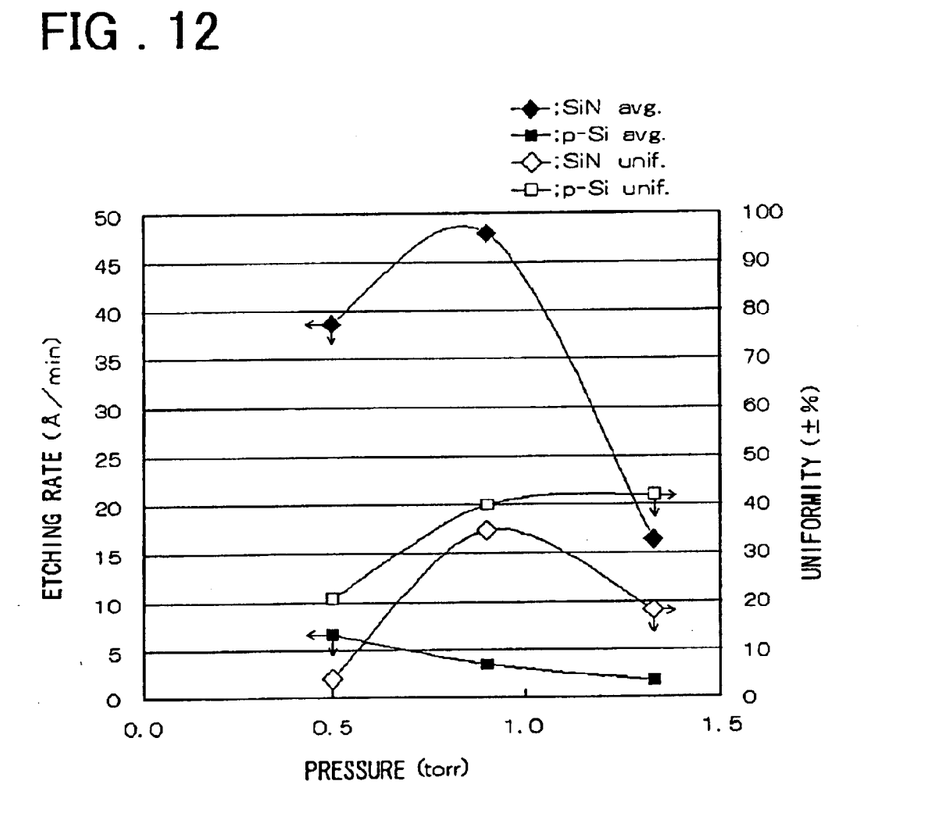
FIG. 12 is a graph showing dependence on pressure versus an etching rate of a surface uniformity of a silicon nitride film and polysilicon.

Next, relations among the etching rate, the surface uniformity, a ratio of a reaction gas flow and a pressure in the etching method of embodiment 9 are explained. FIG. 11 is a graph showing a dependence on a ratio of a $CH_2F_2$ gas flow versus the etching rate and the surface uniformity with regard to the silicon nitride film and polysilicon. FIG. 12 is a graph showing a dependence on the pressure versus the etching rate and the surface uniformity with regard to the silicon nitride film and polysilicon.

A sample is the semiconductor substrate 90, of which an etching mask 94 in FIG. 10B is a silicon nitride film, and of which the gate electrode layer 93 is polysilicon. The total pressure of the reaction gas in FIG. 11 is 0.9 Torr (120 Pa). The surface uniformity is calculated by a given formula with regard to the surface; (a maximum etching rate–a minimum etching rate)/(2×an average etching rate). In FIG. 12, an $O_2$ gas flow is 900 sccm, and a $CH_2F_2$ gas flow is 75 sccm.

In the present embodiments, the higher the ratio of the etching rate of the silicon nitride film versus polysilicon (the selective ratio) is, the better is the condition. Referring to FIG. 11, suitable ranges with regard to the ratio of the $O_2$ gas flow and the $CH_2F_2$ gas flow are 85–95% of $O_2$ and 5–15% of $CH_2F_2$, which allow securing 4 or more of the selective ratio, besides, more suitable percentages are about 92% of $O_2$ and 8% of $CH_2F_2$. In case where the percentage of the $O_2$ gas flow is lower than 85%, the surface uniformity of the etched silicon nitride film gets worse remarkably because the etching rate is too rapid. On the other hand, in case where the percentage of the $O_2$ gas flow is higher than 95%, the selective ratio to the silicon oxide film gets lower because the etching rate of the silicon nitride film gets slower for a shortage of F ingredients.

In the process conditions of FIG. 11, a surface uniformity of the silicon oxide film is not very good. It is, however, possible to make the surface uniformity better and to keep the high selective ratio by lowering the pressure. Referring to FIG. 12, each surface uniformity of the silicon nitride film and polysilicon is improved (the roughness getting smaller) with shifting from about 0.8 Torr (110 Pa) to a lower side. Shifting from about 0.8 Torr (110 Pa) to a lower side, the etching rate of the silicon nitride film gets smaller, and the etching rate of the polysilicon gets larger. A range to about 0.1 Torr (10 Pa) may be, however, suitable for securing 4 or more of the selective ratio.

The meritorious effects of the present invention are summarized as follows.

First, $SiO_2$ is efficiently buried in a trench because a trench opening of a silicon nitride film (an etching mask) can be broadened in a dry process. As a result, it is possible to prevent generation of voids etc.

Second, it is possible to perform a pullback with a less number of steps because extra steps of oxidizing and of removing an oxide film for preventing Si from damage caused by a wet process are unnecessary.

Third, it is unnecessary to use a special system or a large system because it is possible to process in a same chamber and on a same stage successively.

Fourth, it is possible to stabilize a process more because variation in the selective ratio can be made smaller.

Fifth, it is possible to control a finished wiring width (a gate wiring dimension etc.) because it is possible to control a trench opening between patterns of an etching mask.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An etching method of a semiconductor substrate in which silicon and a silicon nitride film are exposed on a portion of their respective surfaces, comprising:

an oxidation step of oxidizing said silicon and said silicon nitride film from said portion of their respective surfaces to a given film thickness by spraying said portion of their respective surfaces with substances excited by plasma discharge of only $O_2$ gas; and an etching step of etching said semiconductor substrate oxidized in said oxidation step by plasma using a reaction gas comprising at least $O_2$ gas and $CH_2F_2$ gas.

2. The etching method as defined in claim 1, wherein a process time in said etching step is not less than 2 times to not more than 3 times of a process time in said oxidation step in case where a process temperature in said etching step is equal to a process temperature in said oxidation step.

3. The etching method as defined in claim 1, wherein said semiconductor substrate is heated to a temperature of not less than 200° C. to not more than 350° C. in said oxidation step and is kept at a temperature of not less than 30° C. to not more than 50° C. in said etching step.

4. The etching method as defined in claim 1, wherein said oxidation step and said etching step are alternately repeated more than 1 time.

5. The etching method as defined in claim 1, wherein said oxidation step and said etching step are successively performed in a same chamber and on a same stage.

6. The etching method as defined in claim 1, wherein a total pressure of the reaction gas in said etching step is not less than 10 Pa to not more than 110 Pa.

7. The etching method as defined in claim 1, wherein said semiconductor substrate comprises at least a trench formed in said silicon using said silicon nitride film as an etching mask.

8. The etching method as defined in claim 1, wherein said semiconductor substrate comprises said silicon as a gate electrode layer and said silicon nitride film as an etching mask formed on said gate electrode layer.

9. An etching method of a semiconductor substrate, comprising:

providing a semiconductor substrate in which silicon and a silicon nitride film are disposed at least on a surface of said semiconductor substrate;

forming a trench through all of a thickness of said silicon nitride film and a portion of a thickness of said silicon; and an etching step of etching said silicon nitride film and said silicon by plasma using a reaction gas comprising $O_2$ gas of not less than 85% to not more than 95% of a total gas flow and $CF_2F_2$ gas of not more than 5% to not more than 15% of the total gas flow.

10. The etching method as defined in claim 9, wherein an oxidation step in which said silicon and said silicon nitride film are oxidized from an exposed surface to a given film thickness by spraying said semiconductor substrate with substances excited by plasma discharge of $O_2$ gas as a reaction gas is performed before said etching step.

11. The etching method as defined in claim 10, wherein a process time in said etching step is not less than 2 times to not more than 3 times of a process time in said oxidation step in case where a process temperature in said etching step is equal to a process temperature in said oxidation step.

12. The etching method as defined as in claim 10, wherein said semiconductor substrate is heated to a temperature of not less than 200° C. to not more than 350° C. in said oxidation step and is kept at a temperature of not less than 30° C. to not more than 50° C. in said etching step.

13. An etching method of a semiconductor substrate, comprising:

providing a semiconductor substrate in which silicon and a silicon nitride film are disposed at least on a surface of said semiconductor substrate;

forming a trench through all of a thickness of said silicon nitride film and a portion of a thickness of said silicon; and an etching step of etching said silicon nitride film and said silicon by plasma using a reaction gas comprising at least $O_2$ gas of not less than 80% to not more than 95% of a total gas flow, CF4 gas or $CHF_3$ gas of not more than 5% of the total gas flow and $CH_2F_2$ gas of not less than 5% to not more than 15% of the total gas flow.

14. The etching method as defined in claim 13, wherein an oxidation step in which said silicon and said silicon nitride film are oxidized from an exposed surface to a given film thickness by spraying said semiconductor substrate with substances excited by plasma discharge of $O_2$ gas as a reaction gas is performed before said etching step.

15. The etching method as defined in claim 14, wherein a process time in said etching step is not less than 2 times to not more than 3 times of a process time in said oxidation step in case where a process temperature in said etching step is equal to a process temperature in said oxidation step.

16. The etching method as defined in claim 14, wherein said semiconductor substrate is heated to a temperature of not less than 200° C. to not more than 350° C. in said oxidation step and is kept at a temperature of not less than 30° C. to not more than 50° C. in said etching step.

* * * * *